US012655014B2

(12) United States Patent
Smyth et al.

(10) Patent No.: US 12,655,014 B2
(45) Date of Patent: Jun. 16, 2026

(54) DIRECT DRIVE MEMS SCANNING MICROMIRROR

(71) Applicant: Meta Platforms Technologies, LLC, Menlo Park, CA (US)

(72) Inventors: Katherine Marie Smyth, Seattle, WA (US); Kenneth Alexander Diest, Kirkland, WA (US); Brian Wheelwright, Sammamish, WA (US); Daniel Guenther Greif, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 698 days.

(21) Appl. No.: 18/049,759

(22) Filed: Oct. 26, 2022

(65) Prior Publication Data

US 2023/0271823 A1    Aug. 31, 2023

Related U.S. Application Data

(60) Provisional application No. 63/313,767, filed on Feb. 25, 2022.

(51) Int. Cl.
*G02B 26/08* (2006.01)
*B81B 3/00* (2006.01)

(52) U.S. Cl.
CPC ........ *B81B 3/0021* (2013.01); *G02B 26/0858* (2013.01); *B81B 2201/042* (2013.01); *B81B 2203/0118* (2013.01); *B81B 2203/04* (2013.01); *B81B 2203/06* (2013.01)

(58) Field of Classification Search
CPC ............ B81B 3/0021; B81B 2201/042; B81B 2203/0118; B81B 2203/04; B81B 2203/06; G02B 26/0858; G02B 2027/0178; G02B 27/0172; G02B 27/0176
See application file for complete search history.

(56) References Cited

U.S. PATENT DOCUMENTS

2016/0274354 A1* 9/2016 Fujimoto ........... G02B 26/0833
2019/0068934 A1 2/2019 Giusti et al.
(Continued)

FOREIGN PATENT DOCUMENTS

CN      106814451 A      6/2017
CN      110892306 A      3/2020
CN      111717884 A      9/2020
(Continued)

OTHER PUBLICATIONS

European Search Report for European Patent Application No. 23158234.7, dated Aug. 7, 2023, 6 pages.
(Continued)

*Primary Examiner* — Euncha P Cherry
(74) *Attorney, Agent, or Firm* — McDermott Will & Schulte LLP

(57) ABSTRACT
A direct drive scanning micromirror includes a mirror body defining a mirror surface, and a plurality of curved cantilevers that each extend directly from the mirror body. The shape of the cantilevers and the geometry of the interface between the cantilevers and the mirror body are configured to decrease peak stresses within the micromirror during operation, which may beneficially impact performance and lifetime.

18 Claims, 13 Drawing Sheets

A

B

(56) References Cited

U.S. PATENT DOCUMENTS

2020/0271920 A1 * 8/2020 Hirata .................... G01S 7/4972
2020/0301130 A1 * 9/2020 Boni ...................... H02N 2/028

FOREIGN PATENT DOCUMENTS

CN 113031255 A 6/2021
EP 3640704 A1 4/2020
EP 3712676 A1 9/2020

OTHER PUBLICATIONS

Guillon S., et al., "Effect of Non-Ideal Clamping Shape on the Resonance Frequencies of Silicon Nanocantilevers," Nanotechnology, Apr. 20, 2011, vol. 22, No. 24, 9 pages.
Office Action mailed Dec. 5, 2025 for Chinese Application No. 202310182700.6, filed Feb. 27, 2023, 13 pages.
Office Action mailed Sep. 22, 2025 for European Patent Application No. 23158234.7, filed on Feb. 23, 2023, 6 pages.

* cited by examiner

Micromirror Design Affects Display Image Quality:

- Field-of-View (FOV):

$$\theta_{opt} = 4\theta_{mech}$$

- Resolution: $\propto \lambda/b$
- # of Pixels: $\propto (\theta_{opt}b)/\lambda$
- Frame Rate: Related to $f$
- Distortion: $\propto \delta$

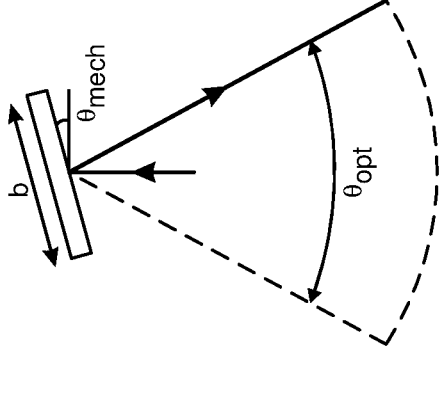

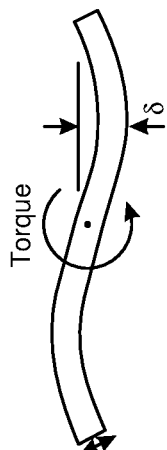

Applied Torque Creates Dynamic
Deformation $\delta$ Resulting in Image
Distortion:

$$\delta \propto \frac{b^5}{t^2}\theta_{mech}f^2 << \frac{\lambda}{5}$$

*FIG. 1*

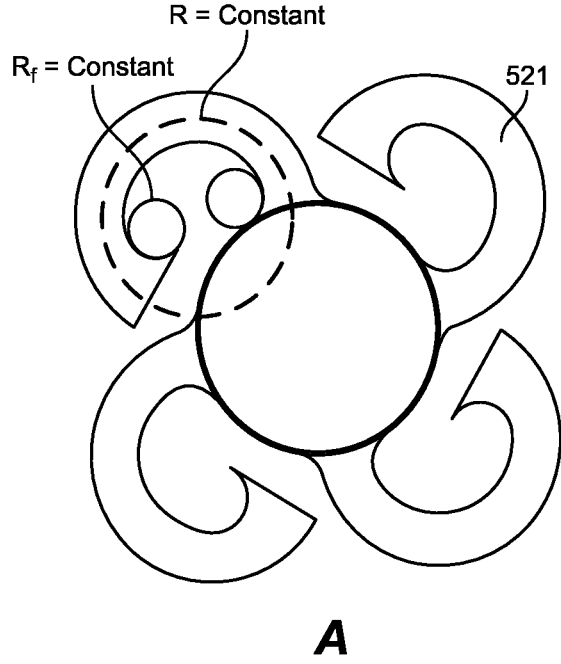
*A*
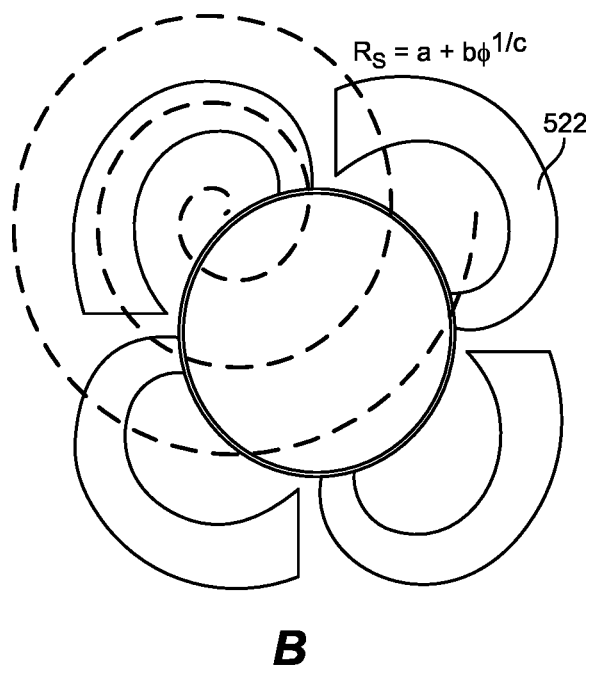
*B*
FIG. 5

*A*

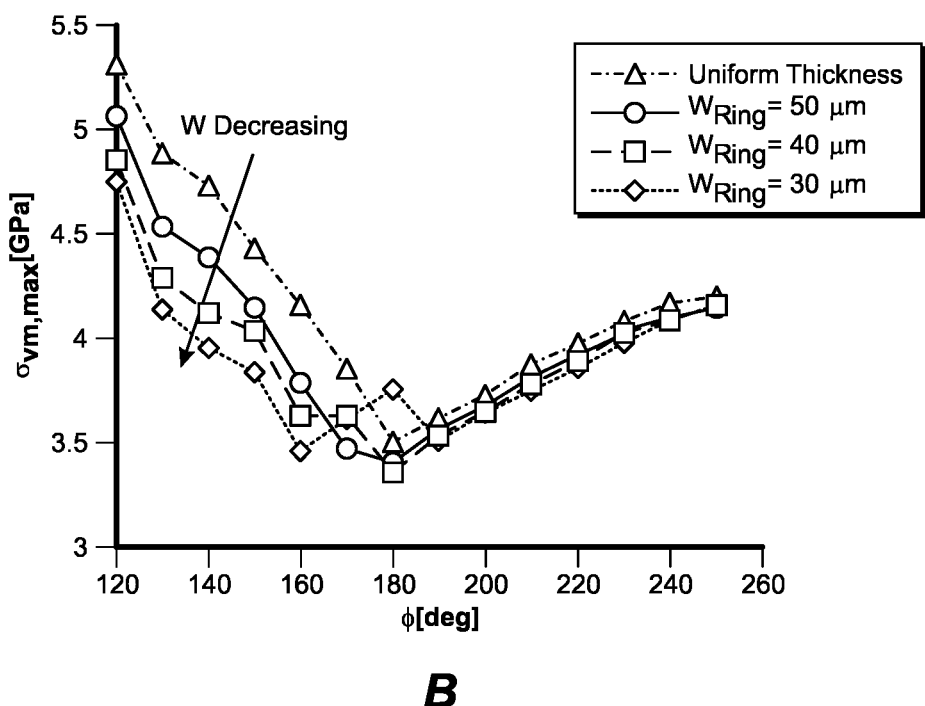
*B*
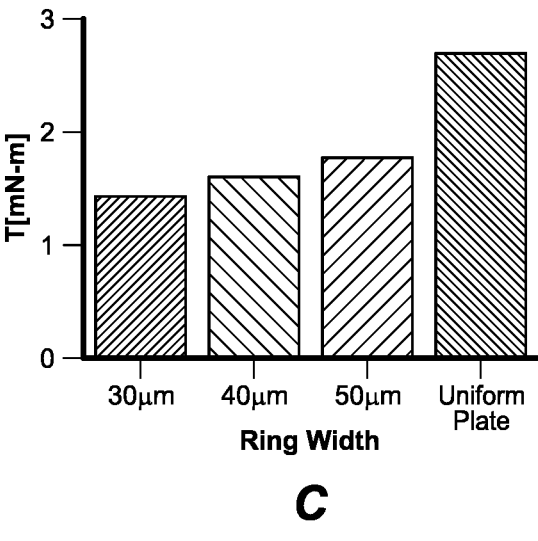
*C*
FIG. 6
*(Continued)*

900

91.3kHz $f_x$=27.8kHz $f_y$=27kHz 12.5kHz

DIRECT DRIVE MEMS SCANNING MICROMIRROR

CROSS-REFERENCE TO RELATED APPLICATION

This application claims the benefit of priority under 35 U.S.C. § 119(e) of U.S. Provisional Application No. 63/313, 767, filed Feb. 25, 2022, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIG. 1 depicts various micromirror geometry scaling relationships in connection with image quality metrics for MEMS scanning micromirrors according to various embodiments.

FIG. 5 illustrates the curvature definitions for various curved actuator beam direct drive scanning micromirrors according to some embodiments.

Figure 2:
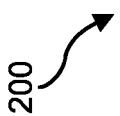
FIG. 2 is a chart comparing the peak von Mises stress in a comparative MEMS micromirror having uniform thickness with comparative MEMS micromirrors having exemplary stiffening architectures for 3-beam and 4-beam gimbal-less configurations according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure relates generally to microelectromechanical systems (MEMS), and more particularly to direct drive MEMS scanning micromirrors. MEMS scanning micromirrors may be incorporated into optical devices and systems to display visual information. During operation, a MEMS scanning micromirror may be configured to oscillate in one or two dimensions while light from a laser or other source, such as an RGB source or superluminescent diode (SLED), reflects from the mirror surface. By varying the angle and timing of the incident light, an image such as a two-dimensional display matrix may be projected and exhibited on a surface. One or more MEMS micromirrors may be used to produce images of varying detail and containing different colors, and may be incorporated into the optical system of a heads-up display.

In 2D optical scanning display applications, for instance, the presently-disclosed direct drive MEMS scanning micromirrors may be used to provide improved image quality, including high pixel density, frame rate, resolution, and field of view. As will be appreciated, these and other properties may scale directly with increasing mirror diameter, resonant frequency, and scan angle. In example direct drive MEMS scanning micromirrors, a resonant frequency may be at least approximately 20 kHz.

In comparative MEMS scanning micromirrors, the mirror design is typically gimballed where the tip/tilt resonance is achieved by driving a twist motion along a torsion beam coupled to the corresponding tip/tilt axis. For 2D scanning, at least two separate gimbals are required to independently drive tip and tilt motion. Because the outer gimbal drives both the mirror and inner gimbal, the driven mass between the tip and tilt axes differs, and achieving a 1:1 frequency ratio between orthogonal tip and tilt axes may be challenging. A ~1:1 frequency ratio is attractive for Lissajous scanning due to fewer associated imaging artifacts and the need for fewer light sources. Additionally, in such comparative designs, peak stress is typically concentrated along the center plane of the torsion beam, which makes for a less flexible design for stress management.

Notwithstanding recent developments, it would be advantageous to provide MEMS scanning micromirrors that overcome fundamental mechanical challenges, including material fatigue, shock and vibration stress limits, and further considerations such as form factor and actuation power that may limit the feasibility of wide angle scanning of larger mirrors at high frequencies. Approaches to addressing these challenges typically involve compromising one or more image quality metrics, such as decreasing mirror size to maintain high field of view and frame rate at the expense of resolution and pixel density. To realize a compelling and realistic virtual experience, particularly in artificial reality applications, achieving state-of-the-art image quality in a compact, controllable, and low power scanning display system is desirable.

Disclosed are gimbal-less, bi-resonant, direct drive MEMS micromirror architectures having curved actuating cantilevers that directly interface with the mirror, obviating the need for a dedicated coupling mechanism between the cantilevers and the mirror body. That is, in a "direct drive" MEMS micromirror, the actuating structure is directly coupled to the mirror and does not include any additional linkage, spring, or coupling feature.

According to various embodiments, the in-plane curvature of the cantilevers may be engineered to mitigate peak stress and the gimbal-less design may enable a compact form factor and a nearly 1:1 frequency ratio between the tip and tilt axes, although other frequency ratios are contemplated, including 1.5:1 or 2:1, or greater, for example. In a "gimbal-less" micromirror, the primary tip and tilt axes need not align with a pivot or center of rotation of an adjacent linkage and/or actuating structure. In particular embodiments, a gimbal-less mirror system does not include a torsion beam. Furthermore, as used herein, a "bi-resonant" micromirror may be configured such that tip and tilt axes may be independently driven at resonance, i.e., in contrast to raster designs where one or more of the axes are driven linearly.

With the disclosed gimbal-less designs not including separate gimbals for 2D motion, the driven masses may be substantially equal, thereby enabling nearly equivalent (1:1) frequency ratios. Additionally, beam geometry dimensions such as length and width may be varied between cantilevers to more flexibly accommodate a wider range of frequency ratios.

According to some embodiments, a direct drive scanning micromirror may include a mirror body defining a mirror surface, and at least three curved cantilevers extending directly from the mirror body. According to further embodiments, a direct drive MEMS scanning micromirror may include a mirror body defining a mirror surface, and a plurality of curved cantilevers extending from the mirror body, where a width of a portion of each of the plurality of curved cantilevers decreases with increasing distance from the mirror body.

According to various embodiments, a direct drive MEMS scanning micromirror may include plural driving cantilevers that are configured to decrease the realized stress during actuation. Additionally, the disclosed scanning micromirrors may be configured to suppress spurious modes during operation and thus improve cross-coupling performance, while providing for setting, and real-time sensing and tuning, of the frequency ratio between tip and tilt axes.

In some embodiments, a stiffening structure may be integrated into the mirror body of a direct drive MEMS scanning micromirror. A stiffening structure may be configured to decrease the mass of the mirror body without compromising its stiffness, and may include a plurality of rib-shaped or pillar-shaped features. Such features may be formed using subtractive processing, such as etching.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-12, detailed descriptions of direct drive MEMS scanning micromirrors, including example structures and methods of operation. The discussion associated with FIGS. 1-10 includes a description of example direct drive MEMS scanning micromirrors having a gimbal-less, bi-resonant design. The discussion associated with FIGS. 11 and 12 relates to exemplary virtual reality and augmented reality devices that may include one or more direct drive MEMS scanning micromirrors as disclosed herein.

Referring to FIG. 1, shown are scaling arguments that relate mirror geometry to display image quality. As will be appreciated, there is a fundamental trade-off between field of view (FOV), resolution, pixel density, and frame rate with distortion caused by dynamic deformation ($\delta$). By way of example, in augmented reality applications where high-density image quality and a wide field of view may be desired, suitable micromirrors may be characterized by a large diameter (b) and high operational frequency (f). To decrease distortion, such micromirrors may be rigid, which infers a greater driving torque and, in turn, generally creates higher stresses in the supporting structure. Elevated stresses during operation may contribute undesirably to a decline in performance or even premature mechanical failure.

The peak stress in a gimbal-less scanning micromirror may be determined principally from the minimum curvature feature in the driving cantilever layout and only to a lesser extent from the total number of beams in the micromirror architecture. Referring to FIG. 2, shown graphically is a comparison of peak von Mises stresses for 3 and 4 beam gimbal-less designs including either a uniform thickness mirror or various mirror stiffening structure designs.

In the comparative examples of FIG. 2, a scanning micromirror 200 includes a mirror body 210 defining a mirror face 215, and a plurality of cantilevers 220 extending indirectly from the mirror body 210. Mirror face may be continuous and homogeneous, for example. In certain embodiments, a central aperture (not shown) may extend through the mirror body 210 and through the mirror face 215. Cantilevers 220 are arranged tangential to the mirror body 210 in the comparative design. The peak stress within the scanning micromirror 200 occurs along the fillet 225 of coupling beam 230 between the mirror body 210 and the driving cantilever 220. Applicants have shown that the peak stress in both the 3 and 4 beam comparative designs occurs along the fillet between the mirror body and the driving cantilever.

Comparative scanning micromirror 200 represents a baseline case and may be characterized by a baseline peak von Mises stress ($\sigma_{max}$) to which the peak stress values in alternate configurations may be normalized. In the illustrated example, scanning micromirror 200 includes a uniform thickness mirror body 210 where the thickness is selected to minimize dynamic deformation. As discussed further herein, a mirror stiffening structure for managing stress may be integrated into the scanning micromirror architecture. Normalized peak von Mises stresses for example stiffening structure designs are shown also in FIG. 2 and inform that peak stresses may be decreased through stiffening structure engineering.

For each comparative micromirror, the lateral dimensions of the cantilevers 220 and coupling beams 230 may be fixed and the respective thicknesses set so that the primary tip and tilt resonant frequencies are each approximately 30 kHz. To maintain the targeted resonant frequency, the cantilever and beam thicknesses (i.e., geometry) may be different amongst different stiffening structure designs, which may manifest as a non-monotonic relationship with peak stress based on a given stiffening structure.

Figure 3:
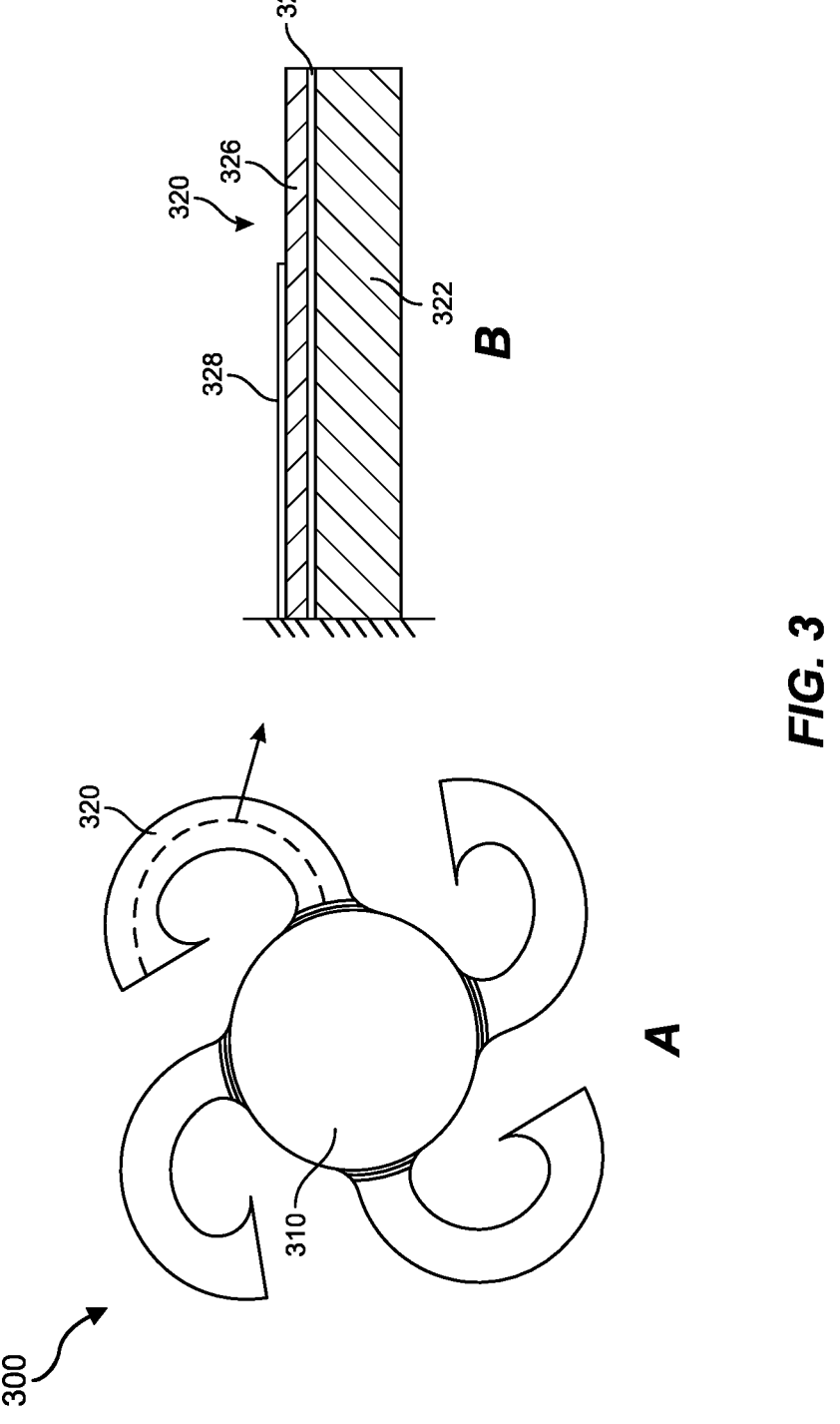
FIG. 3 is a schematic illustration of an example direct drive MEMS scanning micromirror showing (A) a top down plan view of the actuator mirror and beam geometry, and (B) a corresponding cross-sectional view showing the multilayer architecture of an actuator beam according to some embodiments.

In accordance with various embodiments, the tip and tilt motion of a direct drive MEMS scanning micromirror is actuated by the cantilevers, which may each include a piezoelectric unimorph architecture as shown in FIG. 3.

Illustrated in FIG. 3A, direct drive MEMS scanning micromirror 300 includes a mirror body 310 and four cantilever arms 320 extending symmetrically (or asymmetrically) from the mirror body 310. Each cantilever 320 extends directly from the mirror body 310 without any intervening linkage, spring, or coupling feature. Thus, absent from the direct drive MEMS scanning micromirror 300 are the stress concentrations associated with the fillets 225 and coupling beams 230 illustrated in FIG. 2. Furthermore, in contrast to the comparative design of FIG. 2, curved cantilevers 320 are arranged non-tangentially with respect to the mirror body 310.

Referring to the cross-sectional view of FIG. 3B, cantilever arm 320 may have a unimorph architecture that includes, from bottom to top, a substrate 322, a bottom electrode 324, a layer of piezoelectric material 326, and a top electrode 328. The substrate 322 may include a passive material such as silicon (e.g., polycrystalline silicon), for example, and may be dense or porous.

In some embodiments, the term "electrode," as used herein, may refer to an electrically conductive material, which may be in the form of a thin film or a layer. Electrodes may include relatively thin, polymer, inorganic oxide, metal or metal alloy layers and may be of a non-compliant or compliant nature. In some embodiments, the bottom and top electrodes 324, 328 may include a metal such as aluminum, gold, silver, tin, copper, indium, gallium, zinc, alloys thereof, and the like. An electrode may include one or more electrically conductive material, such as a metal, carbon nanotubes, graphene, carbon black, transparent conductive oxides (TCOs, e.g., indium tin oxide (ITO), indium gallium zinc oxide (IGZO), zinc oxide (ZnO), etc.), or other suitably electrically conductive material. By way of example, an electrode may be characterized by an electrical conductivity at room temperature of at least approximately $1 \times 10^5$ S/m.

The bottom electrode 324 may be configured as a ground electrode, and may include a blanket, un-patterned geometry. In some embodiments, the bottom electrode 324 may provide a growth surface, i.e., seed layer, for deposition of piezoelectric material layer 326. The top electrode 328 may entirely or only partially overlie the bottom electrode 324. That is, the top electrode 328 may include a blanket or patterned structure. In examples where an area of the top electrode 328 is less than an area of the bottom electrode 324, an additional electrode (not shown) overlying piezoelectric material layer 326 and separate from the top electrode 328 may be added for tuning and/or sensing. Such an additional electrode may be used for piezoresistive or capacitive-based sensing, for example.

The piezoelectric layer 326 may include any suitable piezoelectric material, including lead zirconate titanate (PZT), barium titanate, lead titanate, lead magnesium niobate-lead titanate (PMN-PT), aluminum nitride (AlN), or scandium-doped aluminum nitride (AlScN), although additional piezoelectric materials are contemplated.

During operation, piezoelectric layer 326 may be actuated via the indirect piezoelectric effect in the $d_{31}$ or bending mode by applying a voltage to one or both of the electrodes and creating an electric field therebetween. The induced stress, with a fixed boundary condition at the end of the cantilever, may cause the cantilever to bend and produce an attendant deformation at the edge of the mirror. In the example of a curved beam, the deflection may be in and out of plane and may be accompanied by a twist motion.

Figure 4:
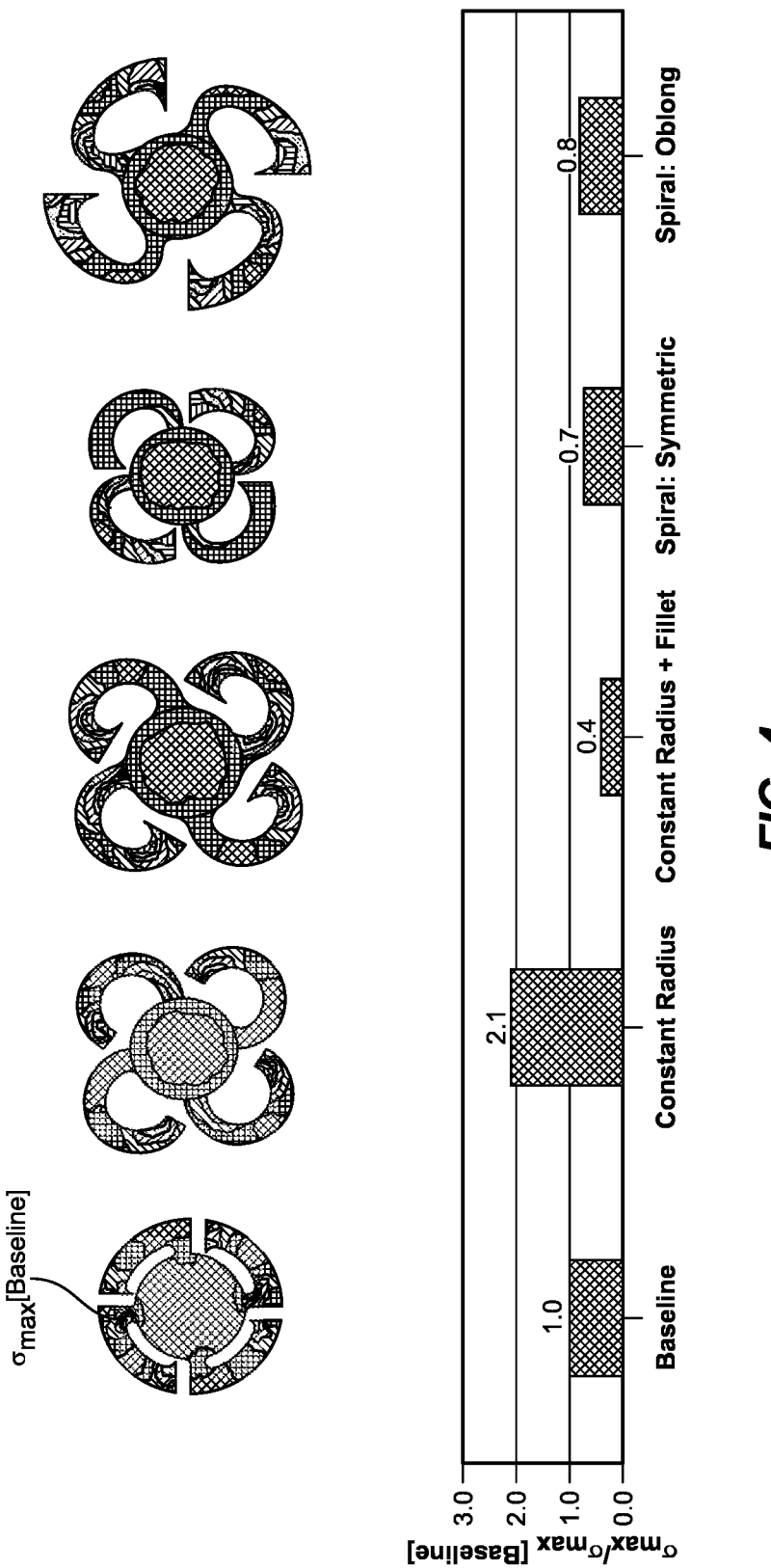
FIG. 4 shows simulated peak von Mises stresses in example direct drive actuator beam geometries according to certain embodiments.

Referring to FIG. 4, in addition to the comparative baseline mirror architecture, illustrated are various example 4-beam direct drive MEMS scanning micromirror architectures. For each example, shown also is a corresponding graphic that illustrates the peak von Mises stress normalized to the comparative baseline case. In the constant radius, constant radius plus fillet, symmetric spiral, and oblong spiral geometries, the cantilevers each interface approximately perpendicularly with the mirror body, which may significantly decrease the peak stress. Moreover, the curvature of each cantilever may be configured to eliminate undesired stress concentrations.

In some embodiments, a curved cantilever may be defined by a primary radius of curvature, which may be constant or variable. For instance, the cantilever geometry may be defined by a constant primary radius of curvature and a constant fillet radius of curvature. In some embodiments, a curved cantilever and the mirror body may each have a radius of curvature where the radius of curvature of the cantilever is less than the radius of curvature of the mirror body. In some embodiments, a curved cantilever and the mirror body may each have a radius of curvature where the radius of curvature of the cantilever is substantially equal to the radius of curvature of the mirror body. In some embodiments, a curved cantilever and the mirror body may each have a radius of curvature where the radius of curvature of the cantilever is greater than the radius of curvature of the mirror body. In further examples, a cantilever may be defined by a primary radius of curvature that varies as a function of angular position. Example curved cantilever structures are shown in FIG. 5, where in FIG. 5A each circular cantilever 521 includes a constant primary radius of curvature (R) and a constant fillet radius of curvature (R_f), and in FIG. 5B spiral cantilevers 522 may be defined by an angularly-variable radius of curvature, e.g., $R_s = a + b\phi^{1/c}$, where a, b, and c are constants, and $\phi$ is the angle of rotation as the curve spirals.

The architecture of a direct drive MEMS scanning micromirror, including the geometry of curved cantilevers, may be configured to avoid stress concentrations thus decreasing peak stresses. According to some embodiments, an engineered beam geometry and the implementation of curved cantilevers may have a substantial effect on stress mitigation, including in micromirrors that operate at higher torque values. By tuning the angular extent (or length) of the cantilevers, the peak stress in the micromirror may be decreased by a factor of 2 or more relative to the baseline case.

Figure 6:
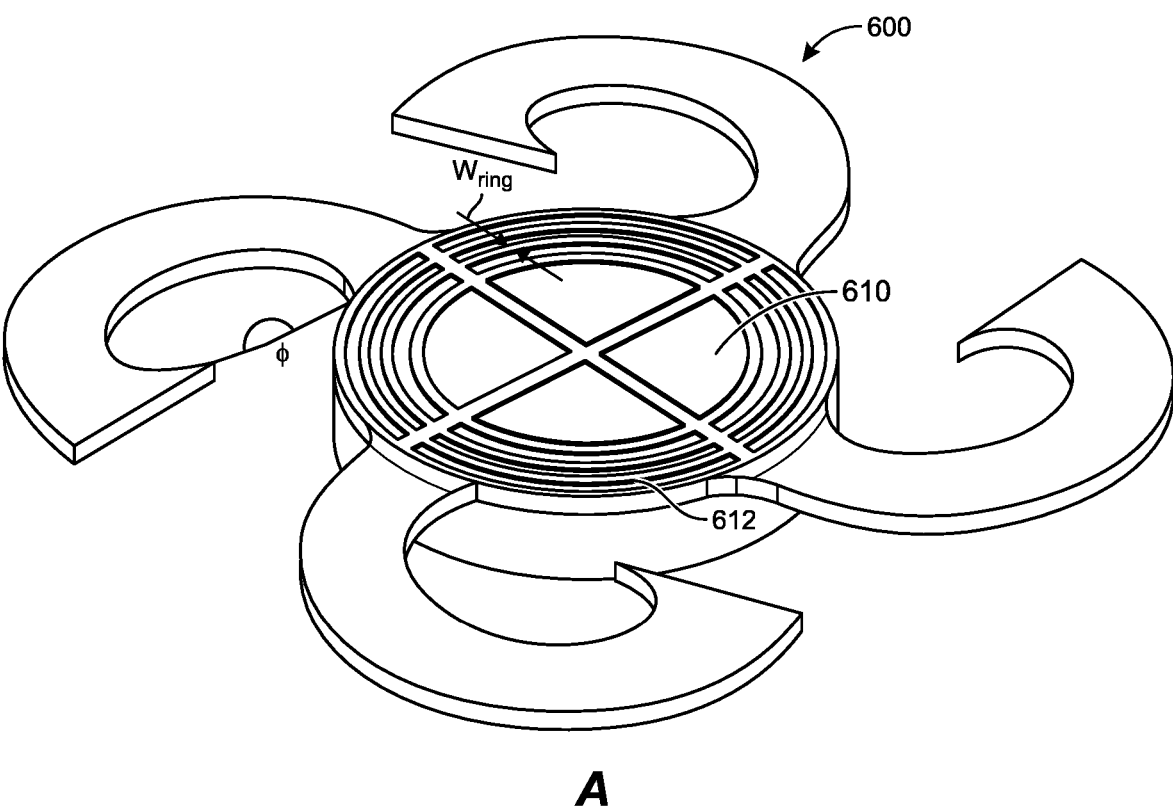
FIG. 6 is a plot showing (A) a direct drive MEMS scanning micromirror having an integrated backside stiffening structure, (B) the effect of curved actuator beam geometry on the peak von Mises stress as a function of the angular extent (or length) of a cantilever for designs having different stiffening structure rib widths, and (C) the torque requirement for each stiffening structure geometry according to certain embodiments.

In addition to the foregoing, and with reference to FIG. 6, a direct drive MEMS scanning micromirror 600 may include a stiffening structure that is adapted to decrease the mass of the mirror body without compromising its stiffness. Referring to FIG. 6A, a stiffening structure may be integrated into the backside of mirror body 610, i.e., opposite to the mirror surface. A stiffening structure may include a plurality of ribs 612 that may be formed in mirror body 610 using subtractive processing, such as milling or etching. A plurality of ribs 612 may be concentric, for example, and/or arranged biaxially across the backside of the mirror body 610, as shown in FIG. 6A, although additional configurations are contemplated. In lieu of, or in addition to, rib-shaped structures, a stiffening structure may include features such as pillars, for example. A mirror body having a stiffening structure may be characterized by a non-uniform thickness.

Referring to FIG. 6B, shown is a plot of peak von Mises stress as a function of the angular extent (or length) of the cantilever for micromirror designs that include a stiffening structure having varying rib width. Generally, the peak stress is less for narrower ribs, and exhibits a minimum for an angular extent ($\phi$) of approximately 180°. The torque requirement for each stiffening structure geometry is plotted in FIG. 6C. In some embodiments, the thickness of each cantilever may be selected to match the operational frequency of the scanning micromirror (e.g., 30 kHz).

In addition to, or in lieu of, stress optimization, the geometry of a direct drive MEMS scanning micromirror, including its three or more cantilevers, may be tuned to obtain the appropriate frequency ratio needed to achieve the desired scan pattern for limiting perceptual artifacts. Without wishing to be bound by theory, a scan pattern of a direct drive MEMS scanning micromirror may be sensitive to its frequency ratio. A desirably low population of imaging artifacts may be achieved at frequency ratios that are nearly equal to, but not exactly equal to, 1:1.

According to some embodiments, a direct drive MEMS scanning micromirror may have a non-axisymmetric structure. That is, a degree of asymmetry may be incorporated into one or more features of the micromirror. A non-axisymmetric structure may desirably avoid the generation of a high artifact scan pattern and, in the example of a 4-beam micromirror, avoid instabilities arising from cross-coupling between the orthogonal axes during operation.

Figure 7:
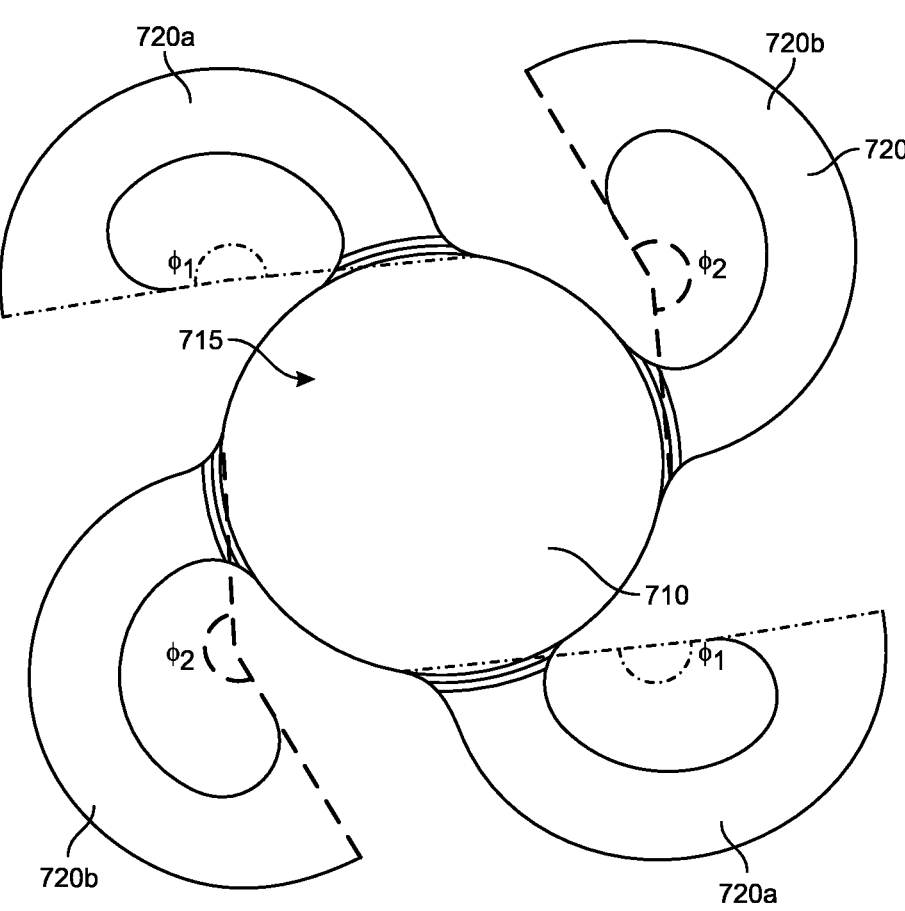
FIG. 7 is a schematic illustration of a direct drive MEMS scanning micromirror having a biaxially asymmetric cantilever design according to some embodiments.

An example direct drive MEMS scanning micromirror having an asymmetric design is illustrated in FIG. 7. Direct drive MEMS scanning micromirror 700 includes a mirror body 710 defining a mirror face 715, and a plurality of cantilevers 720 extending directly from the mirror body 710. A first opposing pair of cantilevers 720a may have an equivalent angular extent $\phi_1$, and a second opposing pair of cantilevers 720b may have an equivalent angular extent $\phi_2$, where $\phi_1 \neq \phi_2$. In example embodiments, a difference between $\phi_1$ and $\phi_2$ may be at least approximately 5°, e.g., approximately 5°, approximately 10°, approximately 15°, approximately 20°, or approximately 25°, including ranges between any of the foregoing values. This angular asymmetry may shift the resonant frequencies of the tip and tilt axes away from a 1:1 ratio, as shown in FIG. 8.

Figure 8:
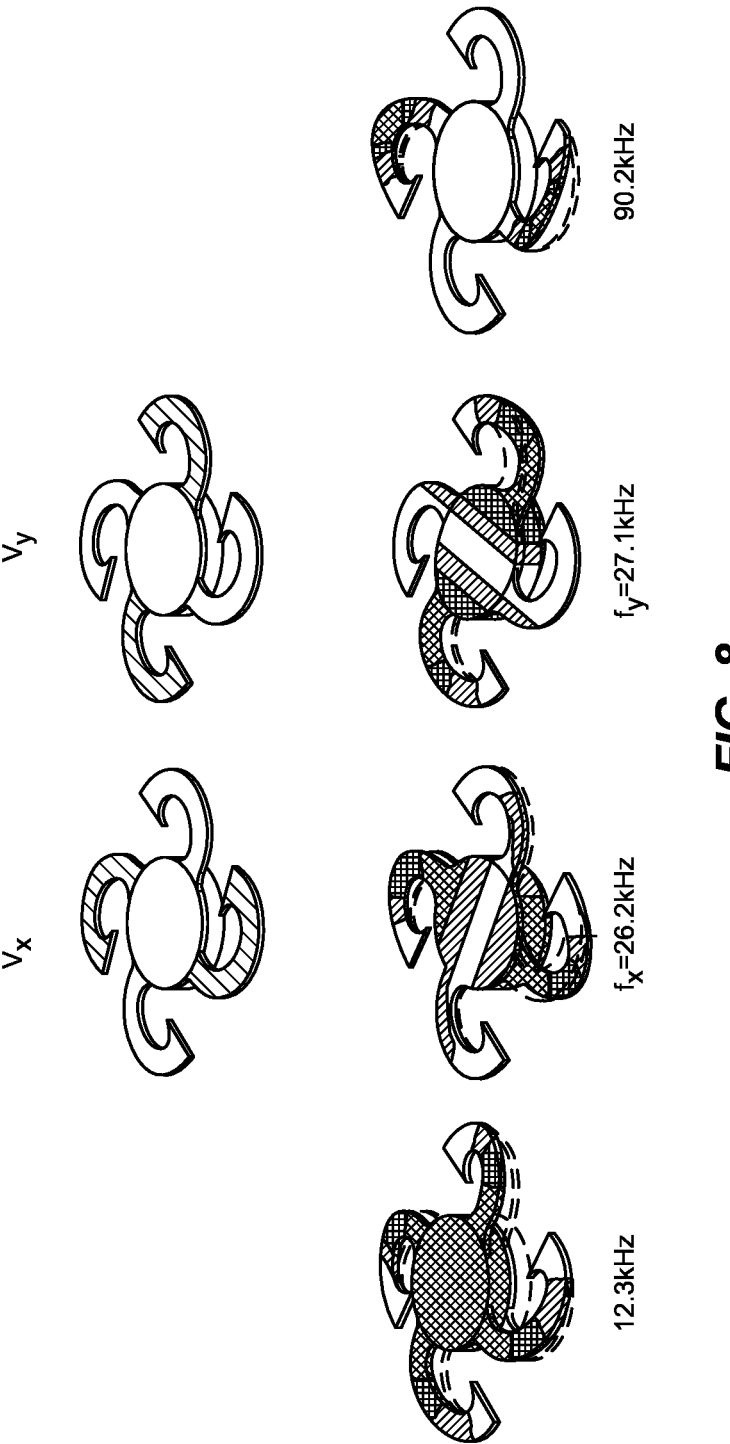
FIG. 8 illustrates the first four resonance modes of the biaxially asymmetric cantilever design of FIG. 7 according to some embodiments.

FIG. 8 depicts the first four resonance modes of an angular extent varying micromirror design with a 5° difference between $\phi_1$ and $\phi_2$. Middle modes show desired tip and tilt resonances and images above show schematically the independent excitation of corresponding electrodes to induce the separate tip and tilt modes. For a bi-resonant structure, the electrode pairs may be excited at the same frequency but shifted 180° out of phase to achieve the illustrated oscillatory up-down motion.

Advantageously, the illustrated cantilever architecture has only one spurious mode in the applicable frequency range up to the third harmonic, whereas comparative micromirror designs with complex beam architectures typically have a substantially higher number of modes at lower frequencies. In some embodiments, the small number of spurious modes may beneficially decrease the effects of cross-coupling.

Figure 9:
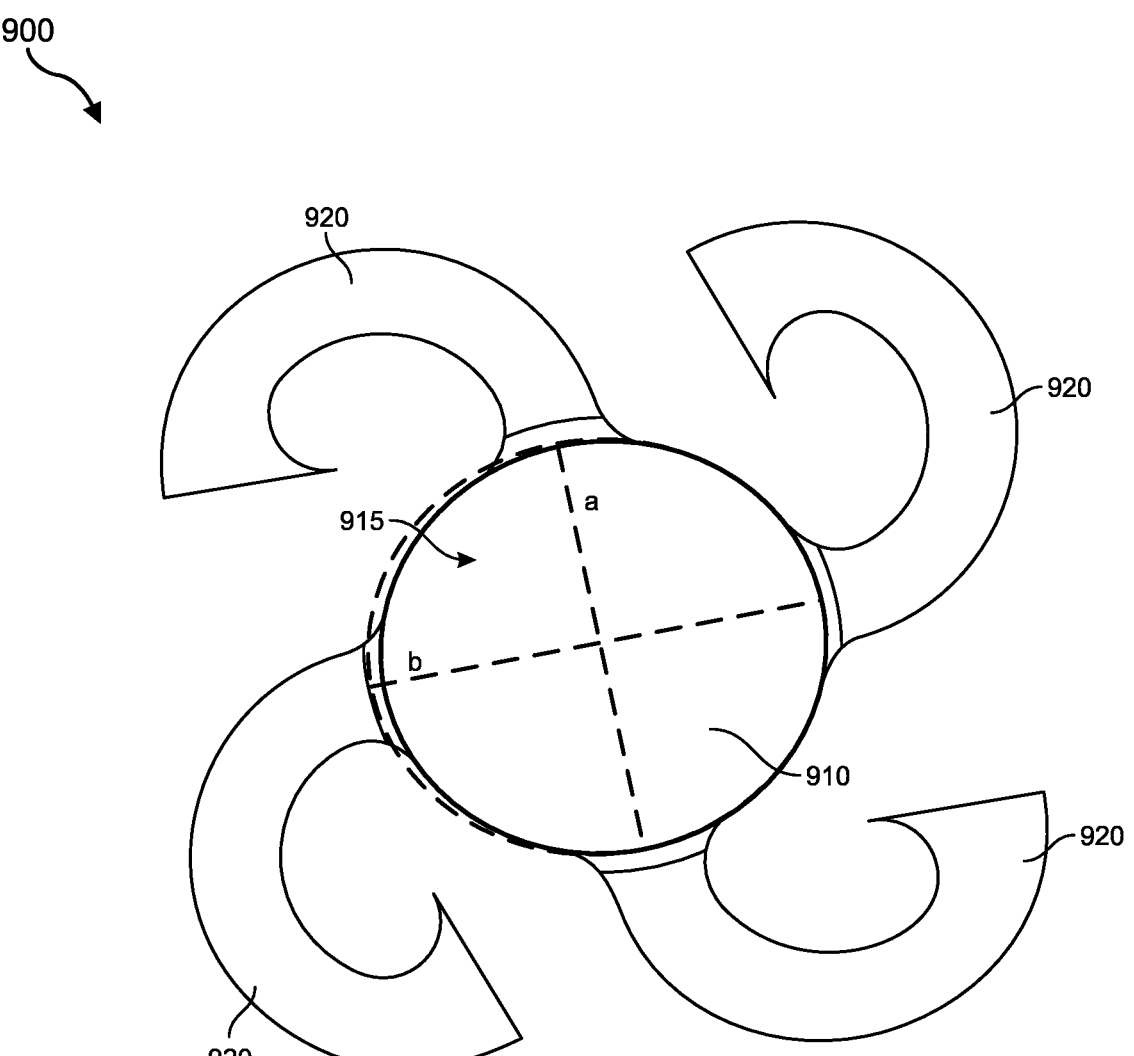
FIG. 9 is a schematic illustration of a direct drive MEMS scanning micromirror having symmetric cantilevers and an elliptical mirror design according to some embodiments.

Referring to FIG. 9, illustrated is a further example of an asymmetric direct drive MEMS scanning micromirror. Direct drive MEMS scanning micromirror 900 includes a mirror body 910 defining a mirror face 915, and a plurality of cantilevers 920 extending directly from the mirror body 910. In the embodiment of FIG. 9, the 4 cantilevers 920 are identical or substantially identical, while mirror body 910 has an elliptical shape having axes of symmetry a and b, where a=0.96b, although further elliptical geometries are contemplated. Further example elliptical mirror bodies may be characterized by the tip/tilt axis relationship a=xb, where the value of the coefficient x may range from approximately 0.8 to approximately 0.99.

Figure 10:
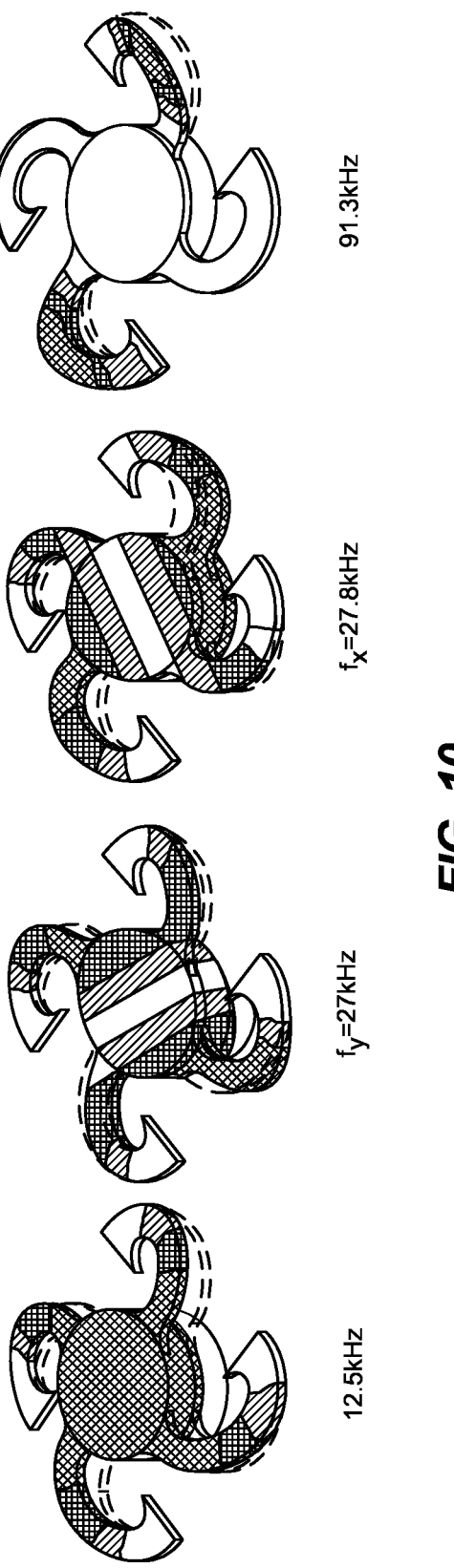
FIG. 10 illustrates the first four resonance modes of the elliptical mirror design of FIG. 9 according to some embodiments.

The asymmetric mirror body may induce a frequency shift between the tip and tilt resonances, as depicted by the first four resonance modes shown in FIG. 10. As in the embodiment illustrated in FIG. 7, elliptically-asymmetric direct drive MEMS scanning micromirror 900 advantageously has only one spurious mode in the range up to the third harmonic.

As disclosed herein, a direct drive MEMS scanning micromirror has a gimbal-less, bi-resonant design and includes a mirror body defining a mirror surface and a plurality of piezoelectrically-driven cantilever arms extending directly from the mirror body. As a direct drive micromirror, the cantilever arms are directly coupled to the mirror body without any additional linkage, spring, or coupling feature.

The cantilever arms may be arched in the plane of the mirror and defined by one or more constant or variable radii of curvature. Example cantilever arm structures are configured to decrease peak stresses within the micromirror during actuation, and achieve a nearly 1:1 frequency ratio between tip and tilt axes, which may be favorable for Lissajous scanning and the avoidance of instabilities arising from cross-coupling between the orthogonal axes. The cantilever arms may include a layer of piezoelectric material disposed between conductive electrodes. Example piezoelectric materials include PZT and AlScN.

The mirror body may have a constant or variable thickness and in some examples may include an integral stiffening structure that is adapted to decrease the mass of the mirror body without compromising stiffness. For example, a stiffening structure may include a plurality of raised ribs located in a surface of the mirror body opposite to the mirror surface. In further embodiments, a stiffening structure may include one or more apertures that extend through the mirror body, such as an array of apertures. Direct drive MEMS scanning micromirrors may be incorporated into various optical display applications, including AR/VR devices and heads-up displays.

EXAMPLE EMBODIMENTS

Example 1: A direct drive scanning micromirror includes a mirror body defining a mirror surface, and at least three curved cantilevers extending directly from the mirror body.

Example 2: The direct drive scanning micromirror of Example 1, where the mirror body has a circular shape.

Example 3: The direct drive scanning micromirror of Example 1, where the mirror body has an elliptical shape.

Example 4: The direct drive scanning micromirror of any of Examples 1-3, where the mirror body has a non-uniform thickness.

Example 5: The direct drive scanning micromirror of any of Examples 1-4, where the mirror body includes a plurality of raised ribs or pillars on a surface of the mirror body opposite to the mirror surface.

Example 6: The direct drive scanning micromirror of any of Examples 1-5, further including an aperture extending entirely through the mirror body.

Example 7: The direct drive scanning micromirror of any of Examples 1-6, where a width of each of the at least three curved cantilevers increases with decreasing distance from the mirror body.

Example 8: The direct drive scanning micromirror of any of Examples 1-7, where a radius of curvature of each of the at least three curved cantilevers is less than a radius of curvature of the mirror body.

Example 9: The direct drive scanning micromirror of any of Examples 1-8, where a radius of curvature of each of the at least three curved cantilevers varies as a function of position.

Example 10: The direct drive scanning micromirror of any of Examples 1-9, where a shape of the micromirror is rotationally asymmetric.

Example 11: The direct drive scanning micromirror of any of Examples 1-10, where the at least three curved cantilevers each include (a) a primary electrode, (b) a secondary electrode overlapping at least a portion of the primary electrode, and (c) a layer of piezoelectric material disposed between the primary electrode and the secondary electrode.

Example 12: The direct drive scanning micromirror of Example 11, where an area of the secondary electrode is less than an area of the primary electrode.

Example 13: The direct drive scanning micromirror of any of Examples 11 and 12, where the layer of piezoelectric material includes a compound selected from AlScN, PZT, AlN, and PMN-PT.

Example 14: The direct drive scanning micromirror of any of Examples 11-13, further including a tertiary electrode overlapping at least a portion of the primary electrode, where the tertiary electrode is electrically isolated from the secondary electrode.

Example 15: The direct drive scanning micromirror of any of Examples 1-14, where the mirror body is configured to oscillate in orthogonal tip and tilt resonance modes with an inter-mode frequency ratio of approximately 1:1.

Example 16: An optical display including the direct drive scanning micromirror of any of Examples 1-15.

Example 17: A direct drive MEMS scanning micromirror includes a mirror body defining a mirror surface, and a plurality of curved cantilevers extending from the mirror body, where a width of a portion of each of the plurality of curved cantilevers decreases with increasing distance from the mirror body.

Example 18: The direct drive MEMS scanning micromirror of Example 17, where a shape of the micromirror viewed along a direction substantially orthogonal to the mirror surface is rotationally asymmetric.

Example 19: The direct drive MEMS scanning micromirror of any of Examples 17 and 18, including a first pair of opposing curved cantilevers having a first shape and a second pair of opposing curved cantilevers having a second shape different from the first shape.

Example 20: A method includes applying a first signal to a first pair of cantilevers of a direct drive scanning micromirror, and applying a second signal to a second pair of cantilevers of the direct drive scanning micromirror, where a frequency ratio between the first and second signals is greater than 1:1, and the direct drive scanning micromirror includes a mirror body defining a mirror surface and at least four curved cantilevers extending directly from the mirror body.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (e.g., augmented-reality system 1100 in FIG. 11) or that visually immerses a user in an artificial reality (e.g., virtual-reality system 1200 in FIG. 12). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 11:
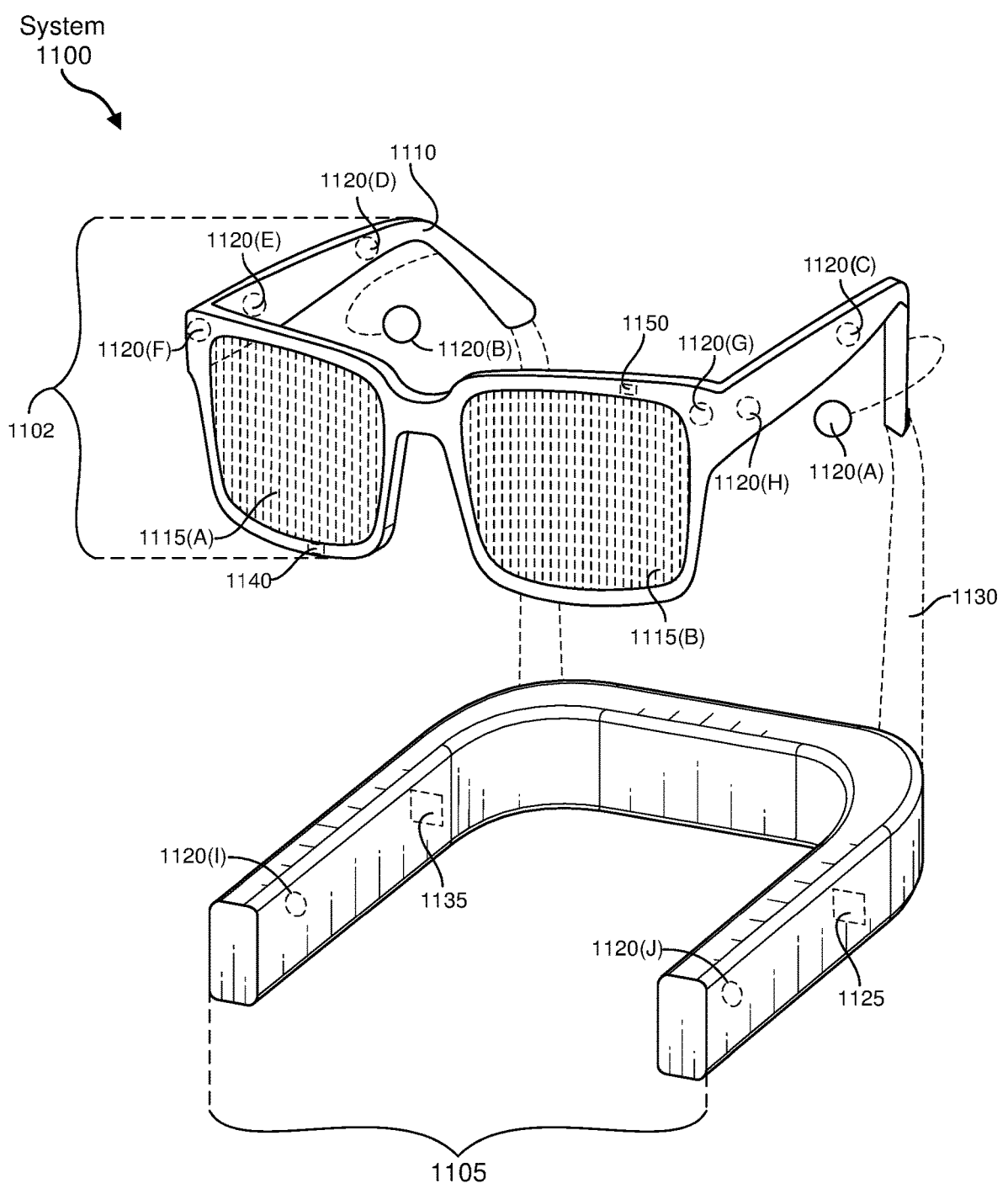
FIG. 11 is an illustration of exemplary augmented-reality glasses that may be used in connection with embodiments of this disclosure.
Figure 12:
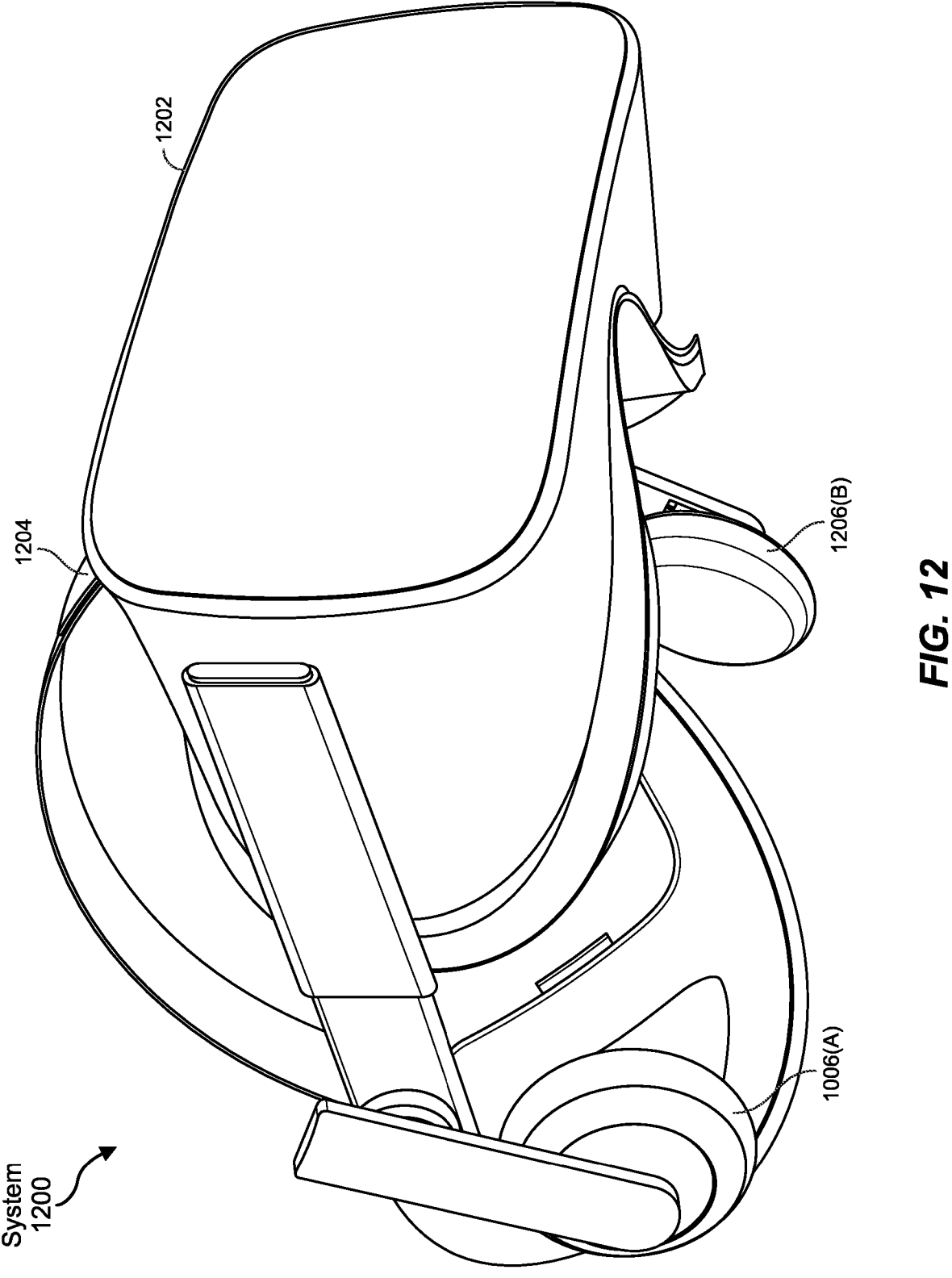
FIG. 12 is an illustration of an exemplary virtual-reality headset that may be used in connection with embodiments of this disclosure.

Turning to FIG. 11, augmented-reality system 1100 may include an eyewear device 1102 with a frame 1110 configured to hold a left display device 1115(A) and a right display device 1115(B) in front of a user's eyes. Display devices 1115(A) and 1115(B) may act together or independently to present an image or series of images to a user. While augmented-reality system 1100 includes two displays, embodiments of this disclosure may be implemented in augmented-reality systems with a single NED or more than two NEDs.

In some embodiments, augmented-reality system 1100 may include one or more sensors, such as sensor 1140. Sensor 1140 may generate measurement signals in response to motion of augmented-reality system 1100 and may be located on substantially any portion of frame 1110. Sensor 1140 may represent a position sensor, an inertial measurement unit (IMU), a depth camera assembly, a structured light emitter and/or detector, or any combination thereof. In some embodiments, augmented-reality system 1100 may or may not include sensor 1140 or may include more than one sensor. In embodiments in which sensor 1140 includes an IMU, the IMU may generate calibration data based on measurement signals from sensor 1140. Examples of sensor 1140 may include, without limitation, accelerometers, gyroscopes, magnetometers, other suitable types of sensors that detect motion, sensors used for error correction of the IMU, or some combination thereof.

Augmented-reality system 1100 may also include a microphone array with a plurality of acoustic transducers 1120(A)-1120(J), referred to collectively as acoustic transducers 1120. Acoustic transducers 1120 may be transducers that detect air pressure variations induced by sound waves. Each acoustic transducer 1120 may be configured to detect sound and convert the detected sound into an electronic format (e.g., an analog or digital format). The microphone array in FIG. 11 may include, for example, ten acoustic transducers: 1120(A) and 1120(B), which may be designed to be placed inside a corresponding ear of the user, acoustic transducers 1120(C), 1120(D), 1120(E), 1120(F), 1120(G), and 1120(H), which may be positioned at various locations on frame 1110, and/or acoustic transducers 1120(I) and 1120(J), which may be positioned on a corresponding neckband 1105.

In some embodiments, one or more of acoustic transducers 1120(A)-(F) may be used as output transducers (e.g., speakers). For example, acoustic transducers 1120(A) and/or 1120(B) may be earbuds or any other suitable type of headphone or speaker.

The configuration of acoustic transducers 1120 of the microphone array may vary. While augmented-reality system 1100 is shown in FIG. 11 as having ten acoustic transducers 1120, the number of acoustic transducers 1120 may be greater or less than ten. In some embodiments, using higher numbers of acoustic transducers 1120 may increase the amount of audio information collected and/or the sensitivity and accuracy of the audio information. In contrast, using a lower number of acoustic transducers 1120 may decrease the computing power required by an associated controller 1150 to process the collected audio information. In addition, the position of each acoustic transducer 1120 of the microphone array may vary. For example, the position of an acoustic transducer 1120 may include a defined position on the user, a defined coordinate on frame 1110, an orientation associated with each acoustic transducer 1120, or some combination thereof.

Acoustic transducers 1120(A) and 1120(B) may be positioned on different parts of the user's ear, such as behind the pinna, behind the tragus, and/or within the auricle or fossa. Or, there may be additional acoustic transducers 1120 on or surrounding the ear in addition to acoustic transducers 1120 inside the ear canal. Having an acoustic transducer 1120 positioned next to an ear canal of a user may enable the microphone array to collect information on how sounds arrive at the ear canal. By positioning at least two of acoustic transducers 1120 on either side of a user's head (e.g., as binaural microphones), augmented-reality device 1100 may simulate binaural hearing and capture a 3D stereo sound field around about a user's head. In some embodiments, acoustic transducers 1120(A) and 1120(B) may be connected to augmented-reality system 1100 via a wired connection 1130, and in other embodiments acoustic transducers 1120 (A) and 1120(B) may be connected to augmented-reality system 1100 via a wireless connection (e.g., a Bluetooth connection). In still other embodiments, acoustic transducers 1120(A) and 1120(B) may not be used at all in conjunction with augmented-reality system 1100.

Acoustic transducers 1120 on frame 1110 may be positioned along the length of the temples, across the bridge, above or below display devices 1115(A) and 1115(B), or some combination thereof. Acoustic transducers 1120 may be oriented such that the microphone array is able to detect sounds in a wide range of directions surrounding the user wearing the augmented-reality system 1100. In some embodiments, an optimization process may be performed during manufacturing of augmented-reality system 1100 to determine relative positioning of each acoustic transducer 1120 in the microphone array.

In some examples, augmented-reality system 1100 may include or be connected to an external device (e.g., a paired device), such as neckband 1105. Neckband 1105 generally represents any type or form of paired device. Thus, the following discussion of neckband 1105 may also apply to various other paired devices, such as charging cases, smart watches, smart phones, wrist bands, other wearable devices, hand-held controllers, tablet computers, laptop computers, other external compute devices, etc.

As shown, neckband 1105 may be coupled to eyewear device 1102 via one or more connectors. The connectors may be wired or wireless and may include electrical and/or non-electrical (e.g., structural) components. In some cases, eyewear device 1102 and neckband 1105 may operate independently without any wired or wireless connection between them. While FIG. 11 illustrates the components of eyewear device 1102 and neckband 1105 in example locations on eyewear device 1102 and neckband 1105, the components may be located elsewhere and/or distributed differently on eyewear device 1102 and/or neckband 1105. In some embodiments, the components of eyewear device 1102 and neckband 1105 may be located on one or more additional peripheral devices paired with eyewear device 1102, neckband 1105, or some combination thereof.

Pairing external devices, such as neckband 1105, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1100 may be provided by a paired device or shared between a paired device and an eyewear device, thus reducing the weight, heat profile, and form factor of the eyewear device overall while still retaining desired functionality. For example, neckband 1105 may allow components that would otherwise be included on an eyewear device to be included in neckband 1105 since users may tolerate a heavier weight load on their shoulders than they would tolerate on their heads. Neckband 1105 may also have a larger surface area over which to diffuse and disperse heat to the ambient environment. Thus, neckband 1105 may allow for greater battery and computation capacity than might otherwise have been possible on a stand-alone eyewear device. Since weight carried in neckband 1105 may be less invasive to a user than weight carried in eyewear device 1102, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 1105 may be communicatively coupled with eyewear device 1102 and/or to other devices. These other devices may provide certain functions (e.g., tracking, localizing, depth mapping, processing, storage, etc.) to augmented-reality system 1100. In the embodiment of FIG. 11, neckband 1105 may include two acoustic transducers (e.g., 1120(I) and 1120(J)) that are part of the microphone array (or potentially form their own microphone subarray). Neckband 1105 may also include a controller 1125 and a power source 1135.

Acoustic transducers 1120(I) and 1120(J) of neckband 1105 may be configured to detect sound and convert the detected sound into an electronic format (analog or digital). In the embodiment of FIG. 11, acoustic transducers 1120(I) and 1120(J) may be positioned on neckband 1105, thereby increasing the distance between the neckband acoustic transducers 1120(I) and 1120(J) and other acoustic transducers 1120 positioned on eyewear device 1102. In some cases, increasing the distance between acoustic transducers 1120 of the microphone array may improve the accuracy of beamforming performed via the microphone array. For example, if a sound is detected by acoustic transducers 1120(C) and 1120(D) and the distance between acoustic transducers 1120(C) and 1120(D) is greater than, e.g., the distance between acoustic transducers 1120(D) and 1120(E), the determined source location of the detected sound may be more accurate than if the sound had been detected by acoustic transducers 1120(D) and 1120(E).

Controller 1125 of neckband 1105 may process information generated by the sensors on neckband 1105 and/or in augmented-reality system 1100. For example, controller 1125 may process information from the microphone array that describes sounds detected by the microphone array. For each detected sound, controller 1125 may perform a direction-of-arrival (DOA) estimation to estimate a direction from which the detected sound arrived at the microphone array. As the microphone array detects sounds, controller 1125 may populate an audio data set with the information. In embodiments in which augmented-reality system 1100 includes an inertial measurement unit, controller 1125 may compute all inertial and spatial calculations from the IMU located on eyewear device 1102. A connector may convey information between augmented-reality system 1100 and neckband 1105 and between augmented-reality system 1100 and controller 1125. The information may be in the form of optical data, electrical data, wireless data, or any other transmittable data form. Moving the processing of information generated by augmented-reality system 1100 to neckband 1105 may reduce weight and heat in eyewear device 1102, making it more comfortable to the user.

Power source 1135 in neckband 1105 may provide power to eyewear device 1102 and/or to neckband 1105. Power source 1135 may include, without limitation, lithium ion batteries, lithium-polymer batteries, primary lithium batteries, alkaline batteries, or any other form of power storage. In some cases, power source 1135 may be a wired power source. Including power source 1135 on neckband 1105 instead of on eyewear device 1102 may help better distribute the weight and heat generated by power source 1135.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1200 in FIG. 12, that mostly or completely covers a user's field of view. Virtual-reality system 1200 may include a front rigid body 1202 and a band 1204 shaped to fit around a user's head. Virtual-reality system 1200 may also include output audio transducers 1206(A) and 1206(B). Furthermore, while not shown in FIG. 12, front rigid body 1202 may include one or more electronic elements, including one or more electronic displays, one or more inertial measurement units (IMUs), one or more tracking emitters or detectors, and/or any other suitable device or system for creating an artificial reality experience.

Artificial-reality systems may include a variety of types of visual feedback mechanisms. For example, display devices in augmented-reality system 1100 and/or virtual-reality system 1200 may include one or more liquid crystal displays (LCDs), light emitting diode (LED) displays, organic LED (OLED) displays, digital light project (DLP) micro-displays, liquid crystal on silicon (LCoS) micro-displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some artificial-reality systems may include one or more projection systems. For example, display devices in augmented-reality system 1100 and/or virtual-reality system 1200 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

Artificial-reality systems may also include various types of computer vision components and subsystems. For example, augmented-reality system 1100 and/or virtual-reality system 1200 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIG. 12, output audio transducers 1206(A) and 1206(B) may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

While not shown in FIG. 11, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

As used herein, the term "approximately" in reference to a particular numeric value or range of values may, in certain embodiments, mean and include the stated value as well as all values within 10% of the stated value. Thus, by way of example, reference to the numeric value "50" as "approximately 50" may, in certain embodiments, include values equal to 50±5, i.e., values within the range 45 to 55.

As used herein, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least approximately 90% met, at least approximately 95% met, or even at least approximately 99% met.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a piezoelectric material that comprises or includes AlScN include embodiments where a piezoelectric material consists of AlScN and embodiments where a piezoelectric material consists essentially of AlScN.

What is claimed is:

1. An artificial reality optical display comprising:
   a direct drive scanning micromirror comprising:
   a mirror body defining a mirror surface; and
   at least three curved cantilevers extending directly from the mirror body, wherein a width of each of the at least three curved cantilevers increases with decreasing distance from the mirror body.

2. The artificial reality optical display of claim 1, wherein the mirror body comprises a circular shape.

3. The artificial reality optical display of claim 1, wherein the mirror body comprises an elliptical shape.

4. The artificial reality optical display of claim 1, wherein the mirror body comprises a non-uniform thickness.

5. The artificial reality optical display of claim 1, wherein the mirror body comprises a plurality of raised ribs or pillars on a surface of the mirror body opposite to the mirror surface.

6. The artificial reality optical display of claim 1, further comprising an aperture extending entirely through the mirror body.

7. The artificial reality optical display of claim 1, wherein a radius of curvature of each of the at least three curved cantilevers is less than a radius of curvature of the mirror body.

8. The artificial reality optical display of claim 1, wherein a radius of curvature of each of the at least three curved cantilevers varies as a function of position.

9. The artificial reality optical display of claim 1, wherein a shape of the micromirror is rotationally asymmetric.

10. The artificial reality optical display of claim 1, wherein the at least three curved cantilevers each comprise:
    a primary electrode;
    a secondary electrode overlapping at least a portion of the primary electrode; and
    a layer of piezoelectric material disposed between the primary electrode and the secondary electrode.

11. The artificial reality optical display of claim 10, wherein an area of the secondary electrode is less than an area of the primary electrode.

12. The artificial reality optical display of claim 10, wherein the layer of piezoelectric material comprises a compound selected from the group consisting of AlScN, PZT, AlN, and PMN-PT.

13. The artificial reality optical display of claim 10, further comprising a tertiary electrode overlapping at least a portion of the primary electrode, wherein the tertiary electrode is electrically isolated from the secondary electrode.

14. The artificial reality optical display of claim 1, wherein the mirror body is configured to oscillate in orthogonal tip and tilt resonance modes with an inter-mode frequency ratio of approximately 1:1.

15. Augmented reality glasses comprising the artificial reality optical display of claim 1.

16. An artificial reality optical display comprising:
  a direct drive MEMS scanning micromirror comprising:
    a mirror body defining a mirror surface; and
    a plurality of curved cantilevers extending from the mirror body, wherein a width of a portion of each of the plurality of curved cantilevers decreases with increasing distance from the mirror body.

17. The artificial reality optical display of claim 16, wherein a shape of the micromirror viewed along a direction substantially orthogonal to the mirror surface is rotationally asymmetric.

18. The artificial reality optical display of claim 16, comprising a first pair of opposing curved cantilevers having a first shape and a second pair of opposing curved cantilevers having a second shape different from the first shape.

\* \* \* \* \*